United States Patent [19]

DuBois

[11] 4,206,404
[45] Jun. 3, 1980

[54] VACUUM FLUORESCENT INDICATOR

[75] Inventor: Richard DuBois, North Caldwell, N.J.

[73] Assignee: Wagner Electric Corporation, Parsippany, N.J.

[21] Appl. No.: 868,678

[22] Filed: Jan. 11, 1978

Related U.S. Application Data

[62] Division of Ser. No. 732,330, Oct. 14, 1976, Pat. No. 4,100,455.

[51] Int. Cl.² .................. G01R 17/02; G01R 19/00
[52] U.S. Cl. .................................. 324/98; 324/96; 324/122; 340/753
[58] Field of Search ................... 324/98, 122, 96; 313/494, 495, 496, 497; 315/169 TV; 350/156; 340/753, 754, 722

[56] References Cited

U.S. PATENT DOCUMENTS

| | | | |
|---|---|---|---|
| 2,956,194 | 10/1960 | Alma et al. | 313/496 |
| 3,668,466 | 6/1972 | Shimada | 315/169 TV |
| 3,682,531 | 8/1972 | Jeffers | 350/156 |
| 3,967,158 | 6/1976 | Saxon | 340/753 |
| 4,004,186 | 1/1977 | Bylander | 313/494 |
| 4,004,220 | 1/1977 | Kerber et al. | 324/122 |
| 4,007,396 | 2/1977 | Wisbey et al. | 350/156 |
| 4,023,876 | 5/1977 | Fukunaga et al. | 313/497 |
| 4,110,665 | 8/1978 | Moore | 340/754 |

*Primary Examiner*—Rudolph V. Rolinec
*Assistant Examiner*—Ernest F. Karlsen
*Attorney, Agent, or Firm*—Eyre, Mann, Lucas & Just

[57] ABSTRACT

A vacuum fluorescent display has a filament heated below incandescence and phosphor coated anodes. A foraminous charge-control electrostatic lens between the filament and the viewer both controls uniform illumination of the anodes and also comprises part of a contrast-enhancement element. An embodiment of the invention with a linear array of anodes and an analog-to-digital power supply forms a linear scale indicator.

2 Claims, 5 Drawing Figures

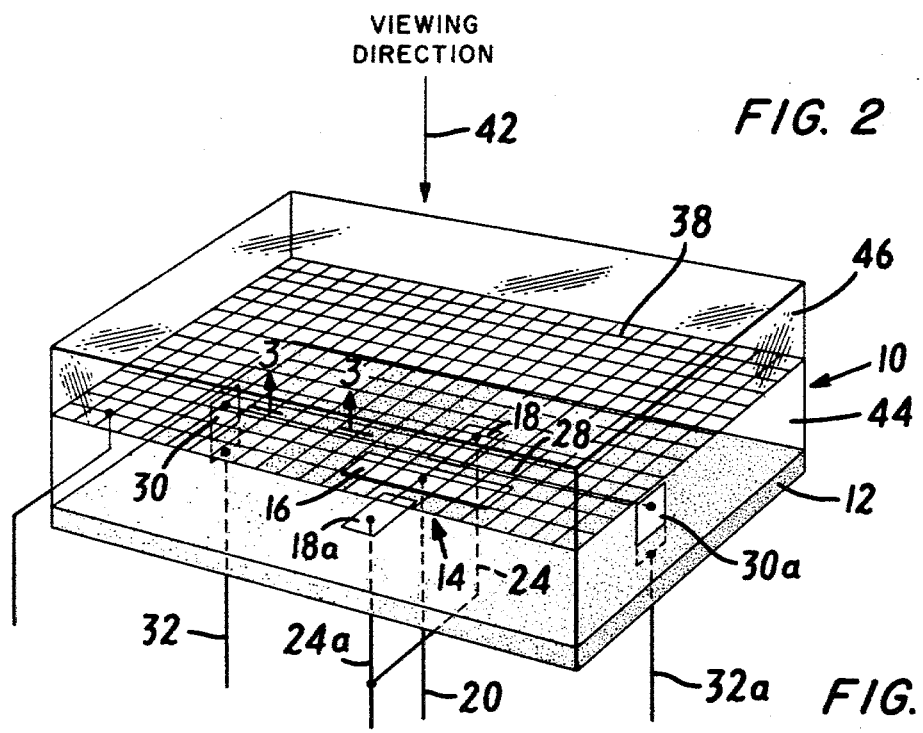
FIG. 2
FIG. 3
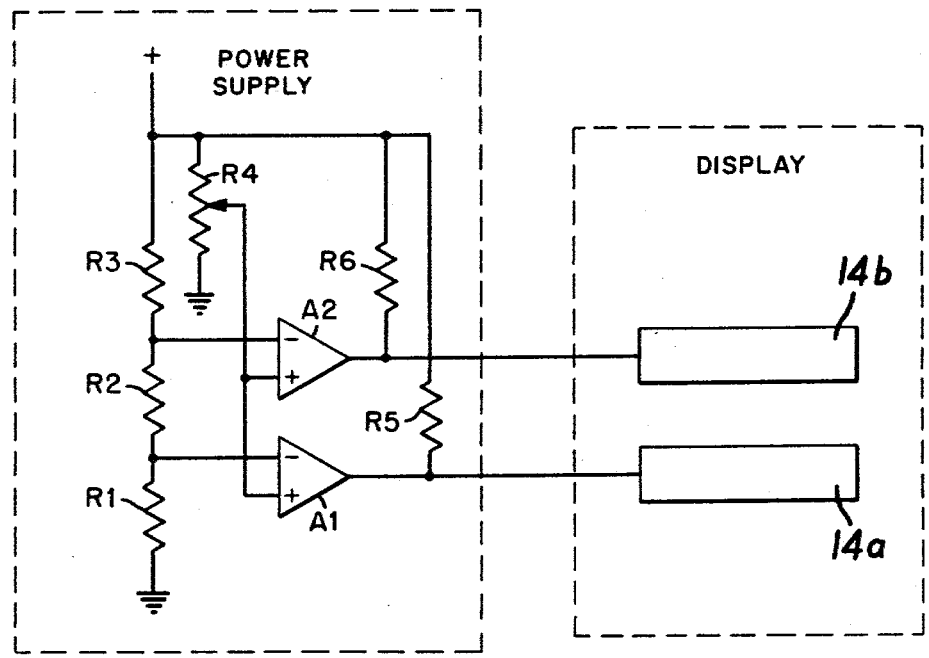
FIG. 5

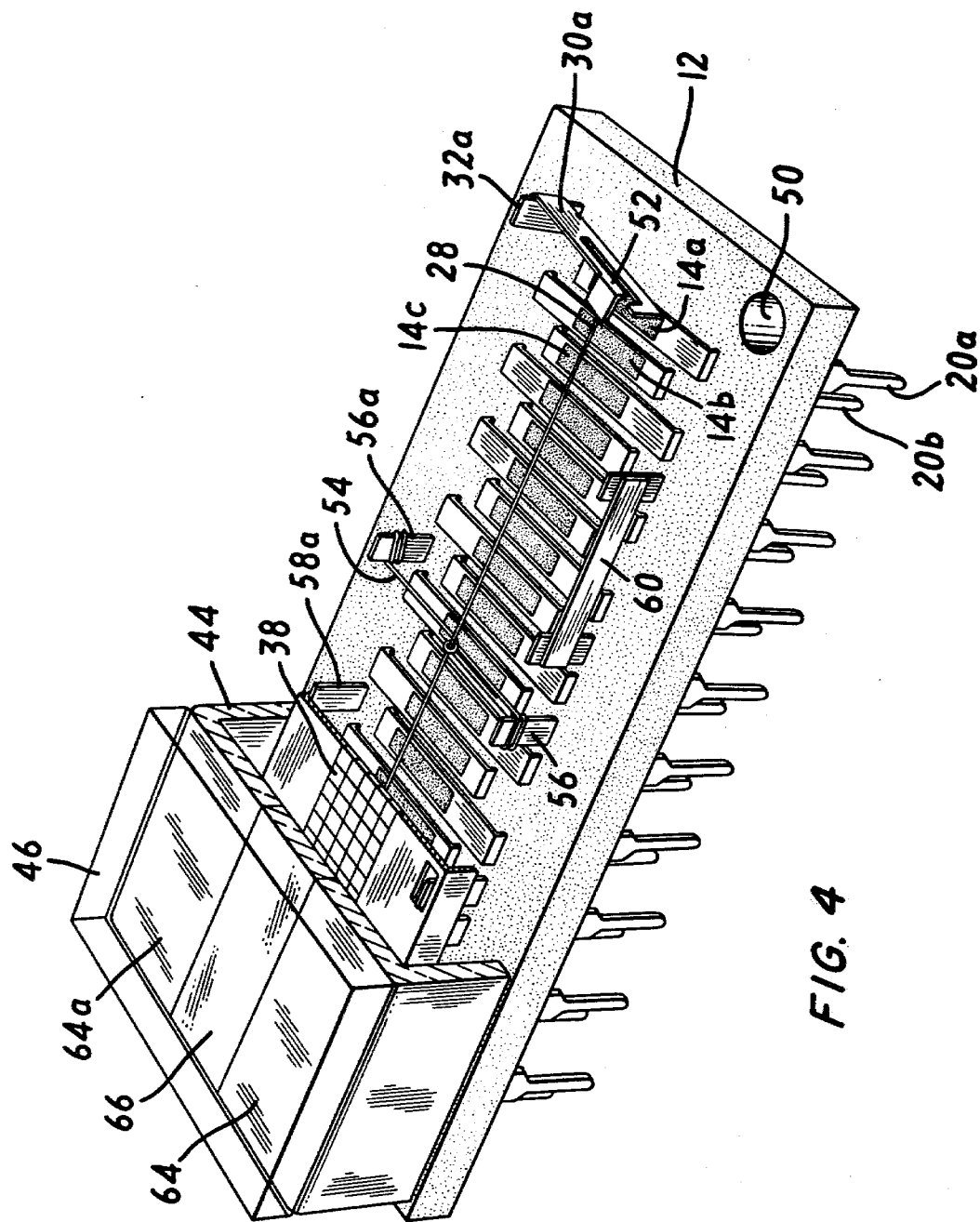

VACUUM FLUORESCENT INDICATOR

This is a division of application Ser. No. 732,330, filed Oct. 14, 1976, now U.S. Pat. No. 4,100,455.

BACKGROUND OF THE INVENTION

Display devices which can be selectably illuminated to convey changing information have become increasingly important. The earliest illuminated display devices were fixed-message signs, such as "exit" or "no smoking" signs which contained a source of light capable of being turned on and off, and a partially translucent face plate containing the message. This type of display suffered washout by strong front illumination. U.S. Pat. No. 3,682,531, issued to A. R. Jeffers teaches a light trap consisting of a circular polarizer and optionally also of a specular foraminous screen to trap ambient light entering the face of the sign.

Electronically controllable display devices have grown particularly with the growth of computers. For example, a gas-discharge device containing a stacked set of transparent plates having shaped discharge regions therein has been in use for many years. The shaped discharge regions may for example form the numerals 0 through 9, one to a transparent plate. When the discharge regions in one plate are electrically energized, the characteristic glow of the gas discharge regions forms one of the numerals. Except when the particular plate illuminated is nearest the viewer, the illuminated numeral is viewed through one or more transparent deenergized plates. When an array of these gas-discharge devices are used to display multiple numerals, the varying distance of the illuminated plates from the viewer gives rise to annoying parallax.

In an attempt to eliminate parallax in a gas-discharge display device, S. M. Frouws, in U.S. Pat. No. 3,418,509, disclosed a planar gas discharge tube containing individually energizable segments spaced away from a counter electrode of transparent conductive material or a fine gauge wire screen through which the viewer observed the segments. The gas discharge was set up between the counter electrode and the energized segments. This device suffered, in common with all gas discharge devices, the need for high voltages and inductive current limiting. This made it impractical to directly drive gas-discharge display devices from modern solid state electronics.

The modern development of vacuum fluorescent display has solved the parallax and high-voltage problems of the gas discharge display devices while requiring the solution of a number of problems of its own.

A vacuum fluorescent display device uses a filament, heated to below incandescent temperature, as a source of thermionic electrons which are then accelerated toward an anode coated with a phosphor capable of fluorescing under bombardment by low-energy electrons. The accelerating voltage can be from a few volts to hundreds of volts but is preferably in the range of from 10 to 30 volts. By selectively accelerating thermionic electrons to desired regions of the phosphor-coated anode, a bright changeable planar display is achieved.

It was discovered by R. DuBois that natural electrostatic charges, such as from a comb run through a person's hair and brought into proximity of a vacuum fluorescent display of the type described, could completely extinguish the display for an extended time. His solution, disclosed in U.S. Pat. No. 3,584,252, consisted in partially encircling the rear and side regions of the anode with a conductive electrostatic shield.

A second problem of unequal illumination of the anode by thermoelectrons has engendered a number of solutions. The problem arises because a convenient method of fabrication includes an insulating substrate, usually glass, behind or embedding the anodes. Charges stored in the insulating substrates so distort the electric field within the vacuum fluorescent device that widely variable illumination of the phosphor occurs. Solutions by R. Raago in U.S. Pat. No. 3,780,326 and by S. Shimada in U.S. Pat. No. 3,668,466 taught the use of an auxiliary electrode in substantially the same plane as the anodes. Application of the correct voltages on the auxiliary electrode could adjust the electrostatic field to achieve uniform illumination or alternatively could extinguish the device. R. Raago in U.S. Pat. No. 3,688,147 solved the problem in a different way by spacing the anode segments on cantilevers far enough forward from the insulating substrate to avoid the distortion of the electrostatic field from charges stored in the insulator. Still another solution, disclosed in varying forms by M. Tanji in U.S. Pat. Nos. 3,619,694 and 3,508,101 and by R. DuBois in U.S. Pat. No. 3,566,187 uses a mesh grid interposed between the filament and the anodes operating in a fashion analogous to a normal electron-tube screen grid to accelerate electrons toward the anode using positive voltage or to cut off electron flow to the anode using negative voltage. Proper adjustment of the positive voltage on the grid was effective to cancel the effect of charges stored in the insulating substrate. In addition, the grid shields the anodes from external electrostatic disturbances. The location of the grid between the filament and the anodes fails to protect the filament from disturbances by external electrostatic fields. In addition, the grid, being positive, attracts electrons to itself. Thus a large current, not contributing to display output, is set up with consequent heating and waste of power.

SUMMARY OF THE INVENTION

The present invention teaches vacuum fluorescent display device containing a thermionic filament heated to below incandescent temperature spaced from at least one phosphor-coated anode which glows when bombarded with electrons. A foraminous charge-control electrostatic lens is spaced at the other side of the thermionic filament from the anode. The phosphor coating glows when bombarded by thermionic electrons accelerated toward it by positive bias with respect to the filament. The foraminous charge-control electrostatic lens connected to a source of positive potential, adjusts the electrostatic field within the display device to achieve uniform illumination of the anode. By removing the lens from between the cathods and anodes, the large screen currents of prior art devices are eliminated. The glowing anode is viewed through the openings in the foraminous electrostatic lens. In one embodiment, the foraminous electrostatic lens is specularly reflecting and is covered by a circular polarizer.

BRIEF DESCRIPTION OF THE DRAWINGS

FIG. 2 shows an embodiment of the present invention which includes a contrast emhancement device.

FIG. 3 shows a close up view of one embodiment of the foraminous screen taken along 3—3 in FIG. 2.

FIG. 4 shows an embodiment of the present invention especially adapted to use as a linear scale indicator.

FIG. 5 shows a simplified schematic diagram of a power supply for a linear scale indicator of the type shown in FIG. 4.

DETAILED DESCRIPTION OF THE PREFERRED EMBODIMENT

Figure 1:
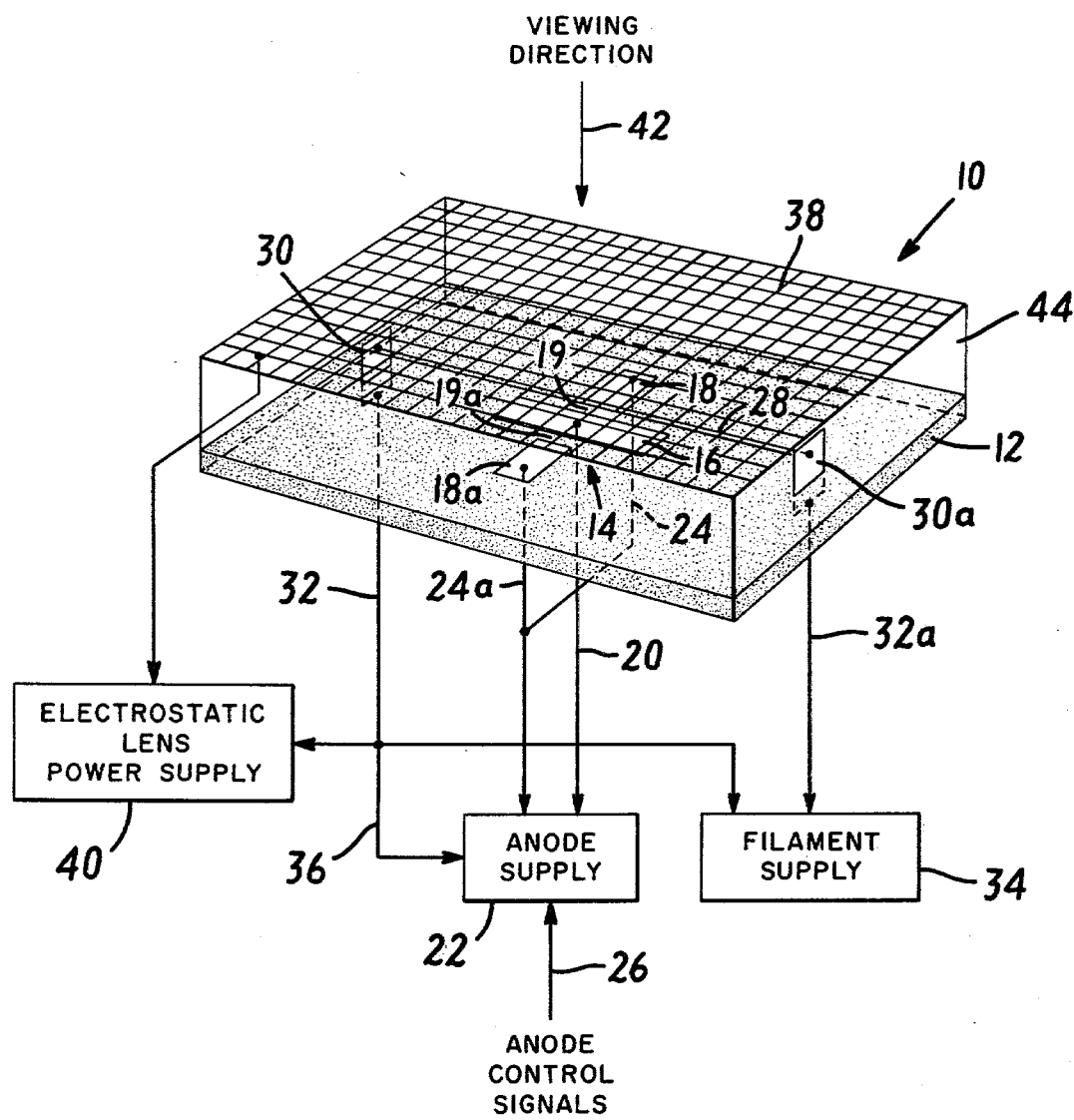
FIG. 1 shows a ghost pictorial perspective view of one embodiment of a vacuum fluorescent display device and a block diagram of power supplies therefor according to the teachings of this invention.

A vacuum fluorescent display device 10 according to the teachings of the present invention is shown in FIG. 1. A substrate 12 of insulating material, such as glass or ceramic, has a shaped phosphor-coated conductive anode 14 upon or embedded within it. Methods of forming shaped conductive areas on or embedded within insulating materials are well known and do not form part of the present invention. The phosphor coating on the conductive anode 14 is applied using any method such as masked spraying or brushing. The conductive anode 14 may be of any convenient planar shape and may comprise a single conductive region or it may be divided into independently controllable subregions of any shape. In the figure, the anode 14 is shown to comprise a + shape, for purposes of illustration, made up of a horizontal bar 16 and two vertical half-bars 18, 18a. Each vertical half-bar 18, 18a is separated from the horizontal bar 16 by an insulating gap 19, 19a. An electrical conductor 20 passes sealably through the substrate 12 electrically connecting the horizontal bar 16 to one output of an anode supply 22. Similarly, electrical conductors 24, 24a pass sealably through the substrate 12 electrically connecting the vertical half-bars 18, 18a to the anode supply 22. It will be evident to one skilled in the art that any anode pattern can be formed and independently connected to the anode supply 22. The anode supply 22 is capable of independently controlling the application of accelerating voltages to the parts of the anode 14 according to anode control signals 16 received from an external source, not shown. Thus, the anode segments 16, 18, 18a can be energized in any desired pattern under the control of the anode control signals 26 as will be described.

One or more heater filaments 28 (only one is shown) preferably in the form of a fine wire is suspended above the anode 14 by two filament supports 30, 30a. The heater filament 28 is treated with a rare-earth oxide coating or by other methods known or which become known to enable it to emit thermoelectrons at dull red color or cooler. Filament leads 32, 32a sealably penetrate the substrate 12 connecting the filament supports 30, 30a to a filament supply 34.

A reference signal 36 is connected from filament lead 32 to the anode supply 22. When a positive voltage with respect to the reference signal 36 is connected to one or more segments of the anode 14, thermoelectrons are accelerated toward those segments of the anode 14. When a negative or neutral voltage is connected to certain anode 14 segments, thermoelectrons are not accelerated toward those anode 14 segments. The phosphor coating on the positively biased anode 14 segments glows under the bombardment of the thermoelectrons whereas the negatively biased segments remain dark. Thus, a variable illuminated pattern can be set up in the anode 14 by selection of those segments to be positively and negatively biased.

Due to the electrostatic charge distribution set up in the substrate 12 and also due to external electrostatic fields, a vacuum fluorescent display device 10 containing only the elements heretofore described will display segments of variable brightness and will be subject to electrostatic disruption of the display. An electrostatic lens 38 connected to an electrostatic lens power supply 40 adjusts the electrostatic field within the display device 10 to overcome the internal electrostatic charge distribution and also shields the filament 28 and anode 14 from external electrostatic disturbances. The electrostatic lens 38 is a transparent conductive surface or a foraminous screen placed in the line of sight 42 between the viewer and the illuminated segments of the anode 14.

A cover 44 having a transparent portion at least in the line of sight 42 is sealed to the substrate 12. The cover 44 and substrate 12 together form a hermetically sealed enclosure within which the anode 14 and the filament 28, with associated parts, are contained. The electrostatic lens 38 is inside the cover 44 to avoid interference from a charge gradient which may be set up across the cover 44. The hermetically sealed enclosure is evacuated to a hard vacuum between $10^{-6}$ and $10^{-9}$ torr using methods well known in the art.

Referring now to FIG. 2, there is shown a second embodiment of the invention containing a circular polarizer 46 interposed in the line of sight 42. As is explained in U.S. Pat. No. 3,682,531, which is incorporated herein by reference, the interposition of a circular polarizer in the line of sight to an internally illuminated display enhances the contrast of the display by trapping incident light while permitting the exit of internally generated light relatively unattenuated.

In FIG. 3, an embodiment of the electrostatic lens 38 which may advantageously be combined with the circular polarizer 46 shown in FIG. 2 to yield an additional contrast enhancement. The electrostatic lens 38 is a foraminous screen containing a plurality of holes 48. The holes may be in any shape and regular placement but their area should comprise from about 10 to about 70 percent, but best contrast enhancement is obtained with hole openings in the range of from about 20 to about 50 percent of the screen area. The preferred range of hole spacing is from about 100 to about 750 lines per inch. The holes may be located at the corners of right squares as in FIG. 3 or they may be along skewed or curved lines. For contrast enhancement with the circular polarizer 46, the side of the foraminous screen 38 nearest the viewer is specularly reflecting. The theory whereby specular reflection in the foraminous screen 38 enhances optical contrast is covered in detail in U.S. Pat. No. 3,682,531. The foraminous screen 38 is made of electrically conductive material and is electrically connected to the electrostatic lens power supply 40 as shown in FIG. 1.

An embodiment of the invention especially adapted to use as a linear scale indicator is shown in FIG. 4. Linear scale indicators are advantageously employed in aircraft, automotive and other applications to indicate the status of measured parameters by the length of an illuminated line.

The substrate 12 is in the shape of a rectangular plate made of a suitable glass or ceramic material but preferably is of black glass due to the fact that it absorbs incident light. An evacuation opening 50 passes through the substrate 12 and is used in a manner well known in the art during the process of evacuating the enclosure. A plurality of bar-shaped anodes 14a, 14b, etc. are disposed in a contiguous parallel array. The anode is partially embedded in the glass substrate 12 and is further retained in position by the passage through the substrate of electrical conductors 20a, 20b, etc. The electrical conductors 20a, 20b, etc. are conveniently shaped at their outer ends for insertion into standard electrical connectors. Alternatively, the electrical conductors 20a, 20b, etc. may be of wire or may have solder fittings adapted to electrical connection by other conventional methods.

The filament supports 30, 30a (30 is hidden) are supported and power is supplied through filament leads 32, 32a. A flat filament tensioning spring 52 applies endwise force to the filament 28 to prevent sagging. The filament may also be supported in its run by a filament support wire 54 which extends laterally from pegs 56, 56a. The foraminous screen 38 is placed above the filament on support legs 58a (the remaining support legs are not shown). At least one of the support legs 58a extends through the substrate 12 and provides external connection for the control voltage. Thus, connection of the foraminous screen 32 to the control voltage performs the functions of the electrostatic lens previously described. A non-flashing or flashing getter bar 60 is supported within the enclosure on a pair of getter bar support legs 62, 62a which provide external electrical connection, not shown. The non-flashing getter bar 60 is used in the final stages of evacuation of the enclosure in a manner well known in the art.

The box shaped cover 44 preferably formed of glass is sealably attached to the upper perimeter of the substrate thereby forming the hermetically sealed enclosure. The outer regions 64, 64a of the glass cover 44 may optionally be blackened to prevent the lateral entry of extraneous light. A rectangular shaped central clear region 66 allows viewing of the illuminated anodes 14a, 14b, etc. through the openings in the foraminous screen 38.

The foraminous screen 38, instead of being independently formed and supported on support legs 58a, could alternatively be produced as a plating photo chemically formed upon the inner surface of the cover 44 with electrical connection to the exterior provided by conventional means.

The circular polarizer 46 may be installed on top of the cover 44 covering at least the clear region 66. Alternatively, the cover 44 itself may be fabricated in such a manner that it, itself, performs the function of a circular polarizer. For best results, the contrast enhancement device described in U.S. Pat. No. 3,682,531 requires that the foraminous screen 38 should be specularly reflecting on its side facing the circular polarizer 46 and that there should be no intervening diffusive or further retarding means interposed between them. Although the presence of the clear glass region 66 between the circular polarizer of the foraminous screen as shown in FIG. 4 somewhat degrades the performance of the contrast enhancement device, the applicant has discovered that the degradation is of acceptable degree.

A portion of an analog to digital anode supply 22 is shown in FIG. 5. For simplicity of description only two anodes 14a and 14b are shown with the associated supply components. It will be understood that the number of anodes may be increased to a large number with each additional anode requiring the addition of a modular set of supply components as shown in FIG. 5. A resistive voltage divider composed of resistors R1, R2 and R3 between the positive supply voltage and ground provides inputs to the negative input terminals of voltage comparators A1 and A2. The second input to the voltage comparators A1, A2 is provided in parallel from a device which generates a measured voltage to be indicated on the display. For purposes of illustration the measured voltage-generating device is shown as a variable resistor R4. Resistors R5 and R6 between the outputs of A1 and A2 respectively and the positive supply allow the zero outputs of A1 and A2 to clamp the voltage at anodes 14a and 14b to ground. Assuming essentially that the wiper of variable resistor R4 is at its ground end, the voltage fed to the input of A1 from variable resistor R4 is less positive than the voltage at the junction of voltage divider resistors R1 and R2. Consequently, voltage comparator A1 provides a zero output to anode 14a. Similarly, voltage comparator A2 provides a zero output to anode 14b. As the wiper of variable resistor R4 is moved toward its positive end, when the voltage thus supplies to voltage comparator A1 just exceeds the voltage at the junction of voltage divider resistors R1 and R2, the output of voltage comparator A1 switches abruptly from zero to positive voltage. Anode 14a thereupon becomes positive, attracts thermal electrons from the filament and begins to glow. The positive voltage at the input of voltage comparator A2 from the junction of the divider resistors R2 and R3, being more positive than the voltage fed to voltage comparator A1, retains voltage comparator A2 in the cutoff condition providing a zero output to anode 14b. As the wiper of variable resistor R4 continues to be moved toward its positive end, when the voltage thus fed to voltage comparator A2 exceeds the voltage at the junction of voltage divider resistors R2 and R3 the output of voltage comparator A2 abruptly changes from zero to positive thereby illuminating anode 14b. Additional anode sections 14c, 14d, etc. can be accommodated by adding one additional voltage divider resistor, voltage comparator and resistor on the output for each section to be added. If all corresponding resistors have the same value, the voltage resolution of the indicator equals the total voltage divided by the number of anode segments. The response of the indicator can be made stepwise non-linear to approximate any desired mathematical curve by suitably choosing the values of the voltage divider resistors.

It will be understood that the claims are intended to cover all changes and modifications of the preferred embodiments of the invention, herein chosen for the purpose of illustration which do not constitute departures from the spirit and scope of the invention.

What is claimed is:

1. A vacuum fluorescent display of the type having an insulating substrate, a plurality of phosphor coated anode segments disposed on said substrate, at least one thermionic filament spaced above said anode segments for providing electrons for exitation of the phosphor on said anode segments, a concave cover plate electrically sealed at its perimeter to said substrate forming thereby a cavity between said cover plate and said substrate, said cavity containing said anode segments and said filament, said cavity being evacuated, wherein the improvement comprises:
   (a) said plurality of phosphor coated anodes being contiguously disposed in a line forming a linear display anode;
   (b) means for individually energizing a contiguous set of a selectable number of said plurality of anode segments whereby a bright line of selectable length is displayed in response to a measured magnitude;

(c) a transparent window in said cover plate facing said plurality of anode segments; and (d) said means for individually energizing comprises:
 (i) a resistive voltage divider producing at lease two positive reference voltages at its functions;
 (ii) at least two voltage comparators having positive and negative inputs;
 (iii) the negative input of each of said voltage comparator being connected to one junction of said voltage divider;
 (iv) the positive input of each of said voltage comparators being connected in parallel to said measured voltage;
 (v) the output of each of said voltage comparators being individually connected to one anode; and
 (vi) a resistor connected from the output of each of said voltage comparators to a positive voltage source.

2. The apparatus recited in claim 1 further comprising:
 (a) a substantially planar self-supporting foraminous screen in said cavity interposed between said window and said plurality of phosphor coated anodes;
 (b) said foraminous screen having a regular pattern of holes therethrough, said holes comprising from about 20 to about 70 percent of the area of said foraminous screen;
 (c) the side of said foraminous screen nearer said transparent window being specularly reflecting;
 (d) means for connecting a voltage to said foraminous screen; and
 (e) a circular polarizer interposed in the line of sight to said foraminous screen.

* * * * *